United States Patent
Komatsu et al.

(10) Patent No.: US 12,259,445 B2
(45) Date of Patent: Mar. 25, 2025

(54) HALL SENSOR USING FACE DOWN STRUCTURE WITH THROUGH SUBSTRATE VIAS

(71) Applicant: TEXAS INSTRUMENTS INCORPORATED, Dallas, TX (US)

(72) Inventors: Daiki Komatsu, Beppu (JP); Masamitsu Matsuura, Beppu (JP)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 144 days.

(21) Appl. No.: 18/146,447

(22) Filed: Dec. 26, 2022

(65) Prior Publication Data
US 2024/0210497 A1    Jun. 27, 2024

(51) Int. Cl.
G01R 33/07    (2006.01)
H10N 52/00    (2023.01)
H10N 52/01    (2023.01)

(52) U.S. Cl.
CPC ........... G01R 33/077 (2013.01); H10N 52/01 (2023.02); H10N 52/101 (2023.02)

(58) Field of Classification Search
None
See application file for complete search history.

(56) References Cited

U.S. PATENT DOCUMENTS

| 10,281,522 | B2 | 5/2019 | Whetsel et al. |
| 2015/0022187 | A1* | 1/2015 | Taylor ................... G01R 33/06 324/207.13 |
| 2018/0149677 | A1* | 5/2018 | Milano ................ G01R 15/148 |
| 2018/0166350 | A1* | 6/2018 | Racz .................... H01L 21/4842 |
| 2020/0300898 | A1* | 9/2020 | Vangerven ........ H01L 21/76898 |
| 2021/0313258 | A1* | 10/2021 | Tuncer ............. H01L 23/49816 |

* cited by examiner

*Primary Examiner* — Jas A Sanghera
(74) *Attorney, Agent, or Firm* — Dawn Jos; Frank D. Cimino (57) ABSTRACT

An integrated circuit (IC) package comprises a semiconductor die having a first surface with a Hall-effect sensor circuit and a second surface. A plurality of through substrate vias (TSV) each having a metal layer extend from the first surface of the semiconductor die to the second surface. The IC package includes a portion of a leadframe having a first set of leads and a second set of leads. The first set of leads provide a field generating current path for directing a magnetic field toward the Hall-effect sensor circuit. The second set of leads are attached to bond pads on the semiconductor die. A first side of an insulator is attached to the leadframe using a die attach material, and a second side of the insulator is attached to the first side of the semiconductor die using a bonding material.

19 Claims, 7 Drawing Sheets

HALL SENSOR USING FACE DOWN STRUCTURE WITH THROUGH SUBSTRATE VIAS

BACKGROUND

The "Hall effect" occurs when a magnetic field is oriented perpendicular to an electric current. The magnetic field generates a voltage difference across a conductor, called the Hall voltage, in a direction which is perpendicular to both the direction of the magnetic field and the direction of the current flow. By measuring the Hall voltage, it is possible to determine the magnitude of the magnetic field. Typical Hall sensors usually include a strip or plate of an electrically conductive material with an electric current flowing through the plate. When the plate is positioned in a magnetic field such that a component of the field is perpendicular to the plate, a Hall voltage is generated within the plate in a direction that is perpendicular to both the direction of the magnetic field and the direction of the current flow.

A Hall effect sensor generally comprises an integrated circuit (IC) die having a semiconductor Hall-effect sensor element to detect a magnetic field produced by the current to be measured and a signal processing chain coupled to an output of the Hall sensor element that are all generally provided in a molded package. Semiconductor Hall effect sensors produced using current techniques typically include a sensing element produced from a silicon die that is mounted on a leadframe. Current flows through the leadframe and is detected by the sensing element. The sensing element requires a high isolation between the silicon die and the leadframe. It is difficult to minimize typical Hall sensor package size due to the long distance between the sensing area on the silicon die and the leadframe current. This distance is created by an insulation layer and the die attach material between the leadframe and the die.

SUMMARY

In an arrangement, a semiconductor package comprises a semiconductor die having a first surface and a second surface with a Hall-effect sensor circuit located on or near first surface. The semiconductor die having a plurality of through substrate vias (TSV). The plurality of TSVs each having a metal layer extending from the first surface of the semiconductor die to the second surface. The semiconductor package including a leadframe having a first set of leads and a second set of leads. The first set of leads provide a field generating current path for directing a magnetic field toward the Hall-effect sensor circuit. The second set of leads are attached to bond pads on the semiconductor die. The semiconductor package further includes an insulator having a first side and a second side. The first side of the insulator is attached to the leadframe using a die attach material, and the second side of the insulator is attached to the first side of the semiconductor die using a bonding material.

The IC package further comprises a redistribution layer (RDL) on the second surface of the semiconductor die. The RDL electrically couples the bond pads on active surface of die to the contact on the second surface of die using TSVs.

The first set of leadframe leads are positioned on a first side of the IC package, and the second set of leadframe leads are positioned on a second side of the IC package.

The IC package further comprises a cavity formed in the bonding material between the insulator and the Hall-effect sensor. The cavity is located adjacent to the Hall-effect sensor circuit. The cavity extends between the second side of the insulator and the first surface of the semiconductor die.

BRIEF DESCRIPTION OF THE DRAWINGS

Having thus described the invention in general terms, reference will now be made to the accompanying drawings, wherein:

DETAILED DESCRIPTION

The present disclosure is described with reference to the attached figures. The figures are not drawn to scale, and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

Corresponding numerals and symbols in the different figures generally refer to corresponding parts, unless otherwise indicated. The figures are not necessarily drawn to scale. In the drawings, like reference numerals refer to like elements throughout, and the various features are not necessarily drawn to scale. In the following discussion and in the claims, the terms "including," "includes," "having," "has," "with," or variants thereof are intended to be inclusive in a manner similar to the term "comprising," and thus should be interpreted to mean "including, but not limited to . . . " Also, the terms "coupled," "couple," and/or or "couples" is/are intended to include indirect or direct electrical or mechanical connection or combinations thereof. For example, if a first device couples to or is electrically coupled with a second device that connection may be through a direct electrical connection, or through an indirect electrical connection via one or more intervening devices and/or connections. Elements that are electrically connected with intervening wires or other conductors are considered to be coupled. Terms such as "top," "bottom," "front," "back," "over," "above," "under," "below," and such, may be used in this disclosure. These terms should not be construed as limiting the position or orientation of a structure or element but should be used to provide spatial relationship between structures or elements.

The term "semiconductor die" is used herein. A semiconductor device can be a discrete semiconductor device such as a bipolar transistor, a few discrete devices such as a pair of power FET switches fabricated together on a single semiconductor die, or a semiconductor die can be an integrated circuit with multiple semiconductor devices such as the multiple capacitors in an A/D converter. The semiconductor device can include passive devices such as resistors, inductors, filters, sensors, or active devices such as transistors. The semiconductor device can be an integrated circuit with hundreds or thousands of transistors coupled to form a functional circuit, for example a microprocessor or memory device. The semiconductor device may also be referred to herein as a semiconductor device or an integrated circuit (IC) die.

The term "semiconductor package" is used herein. A semiconductor package has at least one semiconductor die electrically coupled to terminals and has a package body that protects and covers the semiconductor die. In some arrangements, multiple semiconductor dies can be packaged together. For example, a power metal oxide semiconductor (MOS) field effect transistor (FET) semiconductor device and a second semiconductor device (such as a gate driver die, or a controller die) can be packaged together to from a single packaged electronic device. Additional components such as passive components, such as capacitors, resistors, and inductors or coils, can be included in the packaged electronic device. The semiconductor die is mounted with a package substrate that provides conductive leads. A portion of the conductive leads form the terminals for the packaged device. In wire bonded integrated circuit packages, bond wires couple conductive leads of a package substrate to bond pads on the semiconductor die. The semiconductor die can be mounted to the package substrate with a device side surface facing away from the substrate and a backside surface facing and mounted to a die pad of the package substrate. The semiconductor package can have a package body formed by a thermoset epoxy resin mold compound in a molding process, or by the use of epoxy, plastics, or resins that are liquid at room temperature and are subsequently cured. The package body may provide a hermetic package for the packaged device. The package body may be formed in a mold using an encapsulation process, however, a portion of the leads of the package substrate are not covered during encapsulation, these exposed lead portions form the terminals for the semiconductor package. The semiconductor package may also be referred to as a "integrated circuit package," a "microelectronic device package," or a "semiconductor device package."

The term "through substrate vias" (referred to herein as TSVs) is used herein. TSVs may also be referred to as through-silicon vias. TSVs are vertical electrical connections that extend from a contact formed on the top surface of a wafer or IC die (e.g., contact level or one of the metal interconnect levels) to the backside (bottom) surface. As a result, a TSV comprising device can be attached face-down and utilize vertical electrical paths to couple the contacts to conductive leads or other IC devices. The vertical electrical paths are significantly shortened relative to conventional wire bonding technology, generally leading to significantly faster device operation.

In a Hall sensor, current flows through the leadframe and is detected by a sensor that is embedded in a semiconductor die. The sensing area needs a high isolation between the semiconductor die and the leadframe. In one arrangement, the package size can be minimized by mounting the semiconductor die in a face-down configuration. In this configuration, isolation may be provided by an insulator. A cavity may be formed above the insulator in some arrangements to provide stress isolation.

Figure 1A:
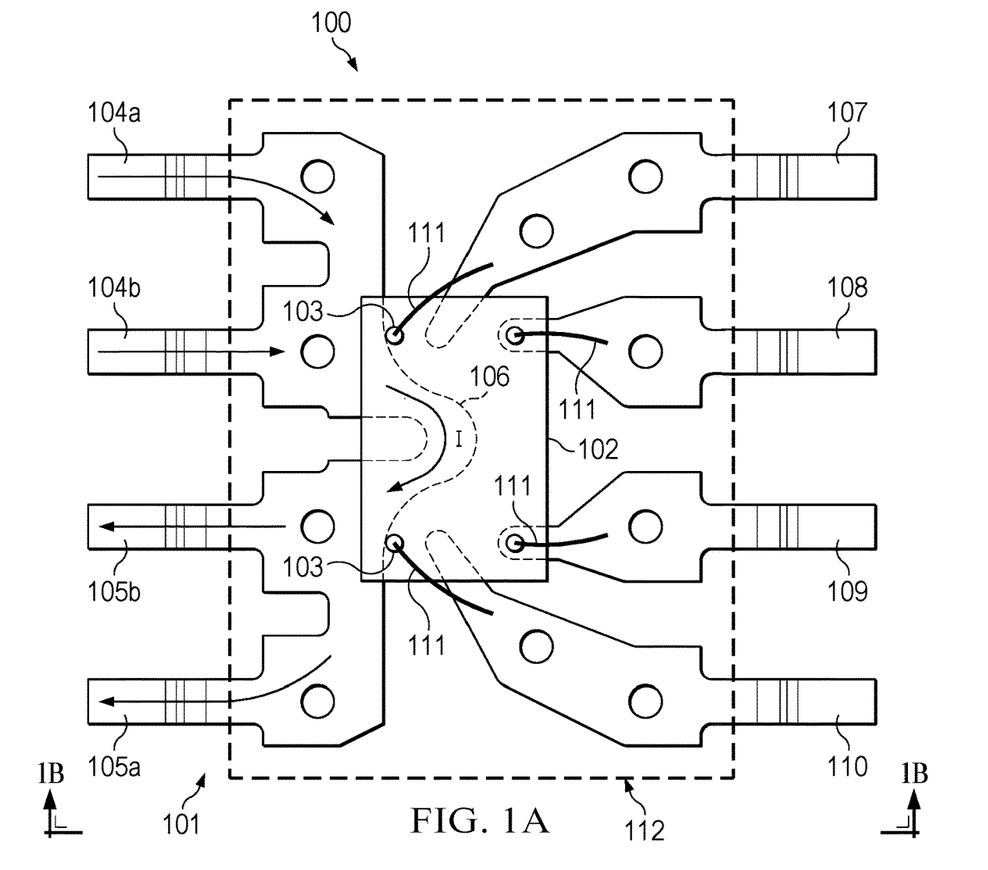
FIG. 1A is a top view of an example Hall-effect sensor device comprising a leadframe with a Hall-effect IC die attached in a face-down configuration.

FIG. 1A is a top view of an example pre-molded Hall-effect sensor device 100 comprising a leadframe 101 with a Hall-effect IC die 102 attached in a face-down configuration. Through substrate vias (TSVs) 103 in IC die 102 provide an electrical connection from contacts on the active surface of IC die 102 to the backside (top when mounted) of the IC die 102. The leadframe 101 comprises a metal or metal alloy, such as copper. Leadframe 102 has a field generating current path side with four terminal leads 104a, 104b, 105a, 105b that are coupled to a curved head section 106 that passes under the IC die 102 without touching the IC die 102. The head section 106 may have a U-shape for directing the field generating current so that a magnetic field reaches a Hall sensor element in IC die 102. In one arrangement, IC die 102 has a Hall-effect element is generally a planar Hall-element that is sensitive to magnetic fields in the vertical direction (i.e., normal to IC die's 102 top and bottom surface). The field generating current I flows in on leads 104a, 104b and then passes through curved head 106 before existing the Hall-effect sensor device 100 on terminals 105a, 105b. The combined field generating current paths may be configured to carry currents up to about 50 A to 100 A for providing a magnetic field oriented normal to the Hall-effect element on the IC die 102.

The leadframe 101 also includes leads 107-110. Leads (or pins) 107-110 may respectively comprise in one arrangement Vcc (i.e., a supply voltage), Vout (i.e., a sensed Hall voltage), Vref (i.e., a reference voltage), and a ground. The respective heads both do not electrically contact the IC die 180. The conventional single leads 107-110 make electrical contact to the TSVs 103 on the IC die 102 via bond wires 111. In one arrangement, as noted above, the lead 107 can comprise VCC, lead 108 can comprise Vout, lead 109 can comprise Vref, and lead 110 can comprise a ground, where in operation a DC power supply applied between lead 107 and lead 110 generates a constant current flow that flows in the semiconductor Hall element, such as in a p-type Hall element. All the respective leads can be manufactured from a single piece in the leadframe strip within a frame. The IC die 102 is then mounted onto the leadframe with an insulator providing isolation, followed by applying a mold compound 112. Lastly the package is trim-and-formed to remove the frame, and the leads bent to form the leads, such as in the gull-wing shape generally shown herein.

Figure 1B:
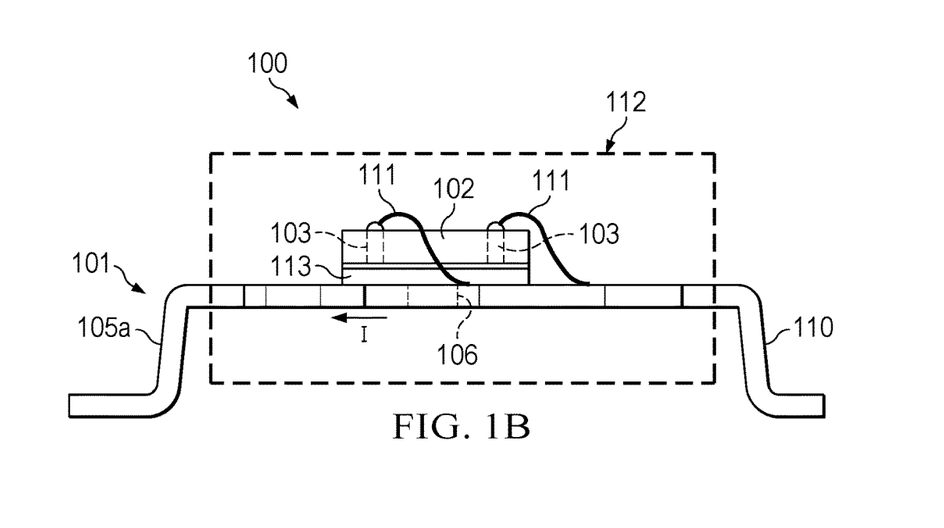
FIG. 1B is a side view of the Hall-effect sensor device shown in FIG. 1A showing an insulator that provides insulation between the leadframe and the Hall-effect IC die.

FIG. 1B is a side view of the pre-molded Hall-effect sensor device 100 shown in FIG. 1A showing the leadframe 101 with insulator 113 that provides insulation between the curved head 106 and Hall-effect IC die 102. The insulator 113 functions as a dielectric spacer that prevents unwanted electrical contact between the current head 106 and the IC die 102. The field generating current I may be split across input leads 104a, 104b and output leads 105a, 105b. The entire field generating current I flows through current head 106 under the IC die 102. Because the view provided in FIG. 1B is a side view, it appears to suggest shorting of the leads 105b and 110, which is clearly not the case for the Hall-effect sensor device 100. Instead, as shown in the top view of FIG. 1A, leads 107-110 are separated laterally from terminal leads 104a, 104b, 105a, 105b.

Although external leads 104a, 104b, 105a, 105b, 107-110 have a gull-wing or cantilevered shape in the arrangement illustrated in FIGS. 1A, 1B, in other arrangements the leads may have other configurations, including but not limited to, the shape of flat leads as used in Quad Flat No-Lead (QFN) devices or in Small Outline No-Lead (SON) devices.

FIGS. 2A-L illustrate steps for fabricating a semiconductor package for a Hall-effect sensor device according to one arrangement. These steps can be used in one implementation to fabricate the device 100 described above. The steps may be used to concurrently fabricate multiple packaged electronic devices in a panelized batch process, with individual packaged electronic devices being separated after or near the end of the process.

Figure 2A:
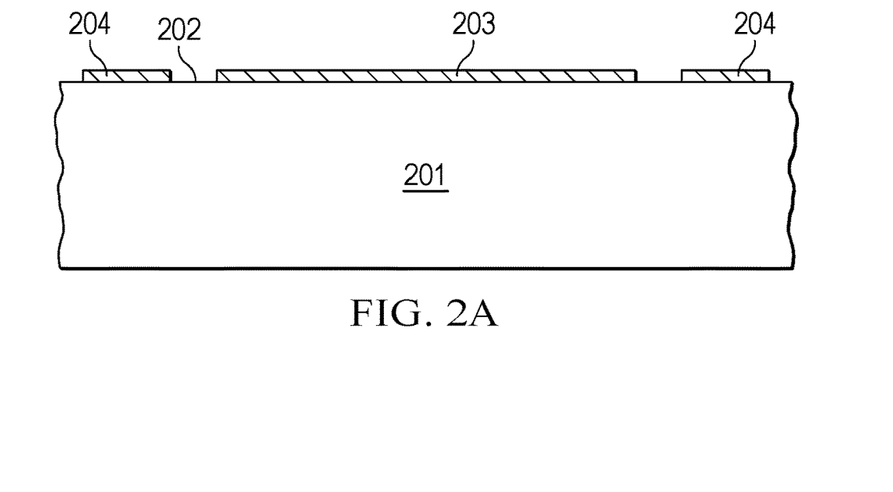
FIGS. 2A-L illustrate steps for fabricating a semiconductor package for a Hall-effect sensor device according to one arrangement.

In FIG. 2A, a semiconductor or IC die 201 has an active surface 202 that is usually the top surface when the semiconductor die 201 is the "face up" configuration. Active surface 201 has a sensing area 203, which may be a Hall-effect element. There are different types of Hall-effect elements, for example, a planar Hall element generally described herein, a vertical Hall element, and a circular vertical Hall element. A planar Hall element is sensitive to magnetic fields in the vertical direction (i.e., normal to the Hall-effect IC die's surface 202). This is the direction of magnetic field produced by a current horseshoe as shown above for the current head 106. Vertical hall elements are constructed to sense fields parallel to the surface of the chip, and different current conductor would be used to produce those fields. A bond pad structure 204 is positioned on surface 202 of the semiconductor die 201. Bond pad 204 may be formed using aluminum in a sputtering process that deposits a conductive aluminum material in a pattern over surface 203.

Figure 2B:
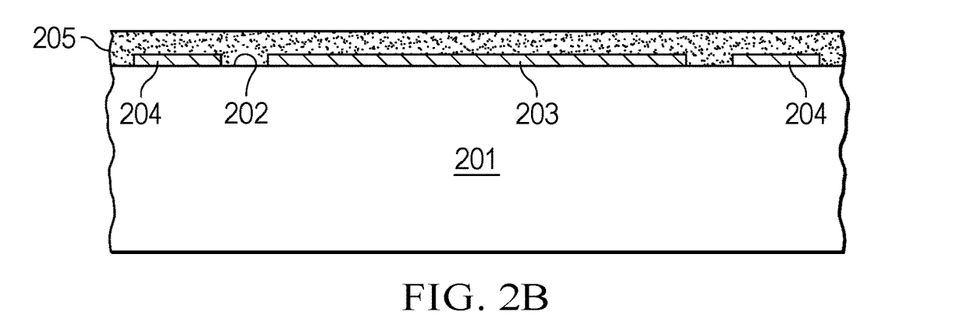

In FIG. 2B, a bonding material 205, such as an adhesive bonding layer, is applied to surface 202. The bonding material 205 covers sensing area 203 and bond pad structure 204. The bonding material 205 may be applied using a spin-coating, a spray, or a lamination process. The bonding material 205 may be an epoxy based material such as SU-8.

Figure 2C:
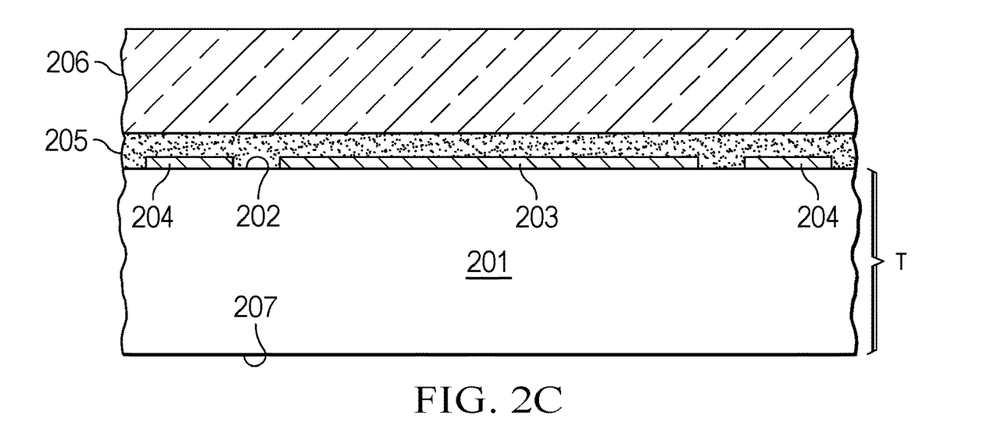

In FIG. 2C, an insulator 206 is bonded to the semiconductor die 201 using the bonding material 205. The insulator works as carrier wafer for the rest of processes such as TSV formation. In the Hall-effect sensor device disclosed herein, the insulator 206 is integrated into the final package and is not later released from the semiconductor die 201. Insulator 206 may be a ceramic or a borosilicate glass, such as Tempax, for example. In one arrangement, the insulator 206 has a thickness of 500 um.

Figure 2D:
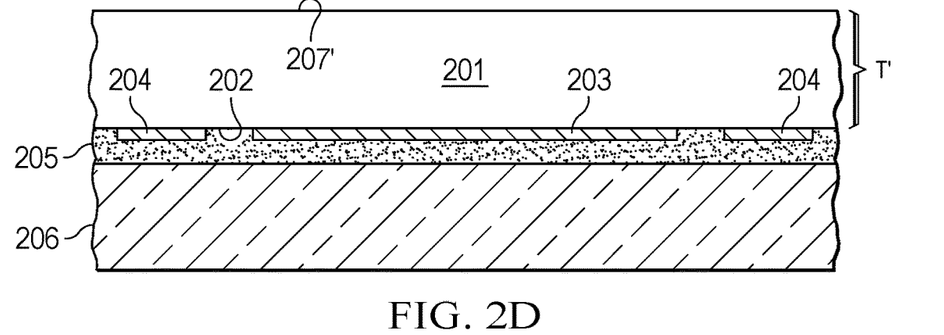

In FIG. 2D, the semiconductor die 201 and insulator 206 device has been turned upside down so that the semiconductor die 201 is in the face-down position (i.e., surface 202 is oriented on the bottom). After the device is inverted, the semiconductor die 201 is thinned by grinding the back surface 207. The back grinding of the semiconductor die 201 exposes a shallower back surface 207' and reduces the thickness from an original thickness T to a final thickness T'. In one arrangement, the semiconductor die is reduced to less than 50 um thick.

Figure 2E:
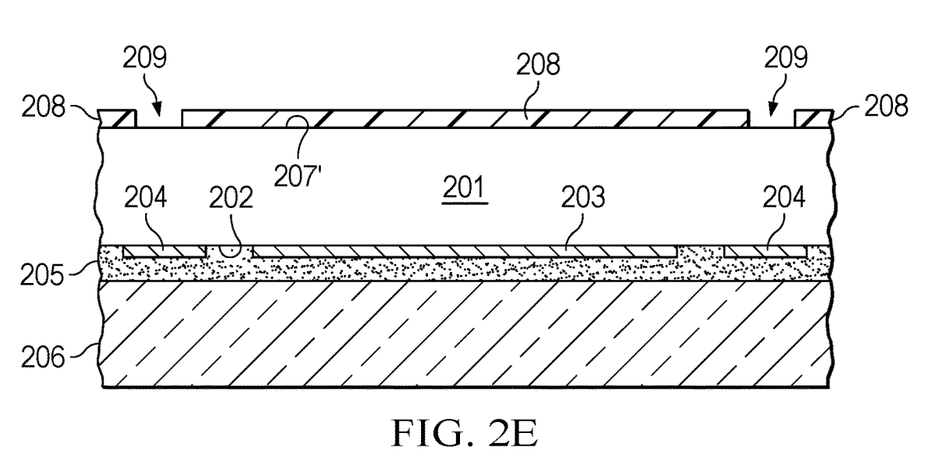

In FIG. 2E, a photoresist layer 208 is patterned over back surface 207'. The photoresist layer 208 may be a liquid type of photoresist that is coated over surface 207'. The photoresist layer 208 is patterned to have openings 209 that are aligned vertically with bond pads 204.

Figure 2F:
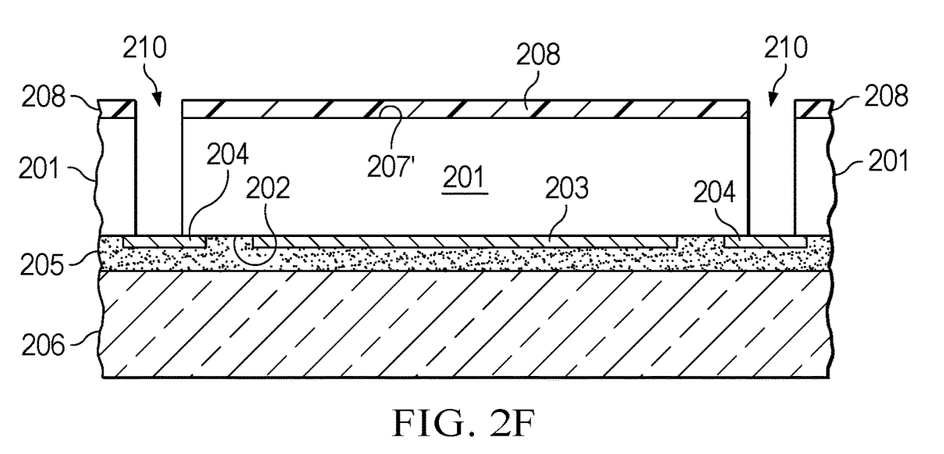

In FIG. 2F, the exposed portions 209 in photoresist layer 208 are etched to create TSVs 210. The etching process is repeated many times until the TSVs 210 extend all the way through the semiconductor die 201 and reach bond pad 204. In one etching process, deep reactive-ion etching (DRIE) is used to create TSVs 210.

Figure 2G:
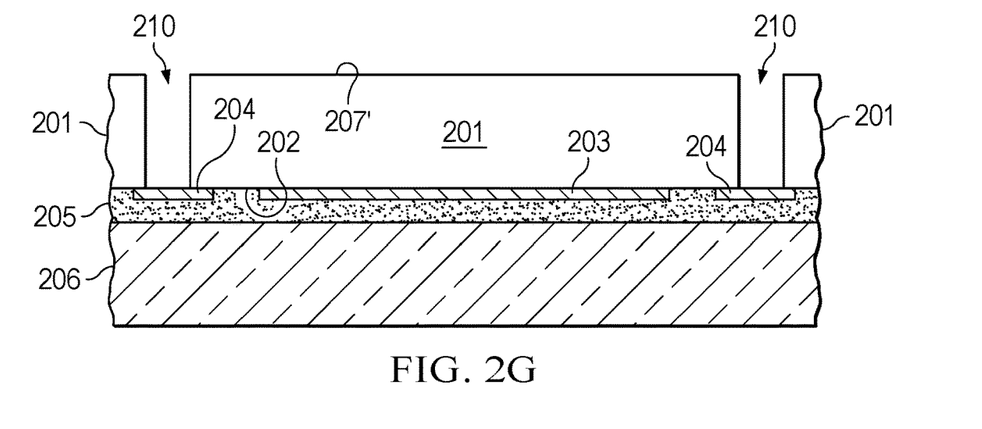

In FIG. 2G, photoresist layer 208 is removed from surface 207' leaving TSVs 210 extending through semiconductor die 201 down to bond pad 204.

Figure 2H:
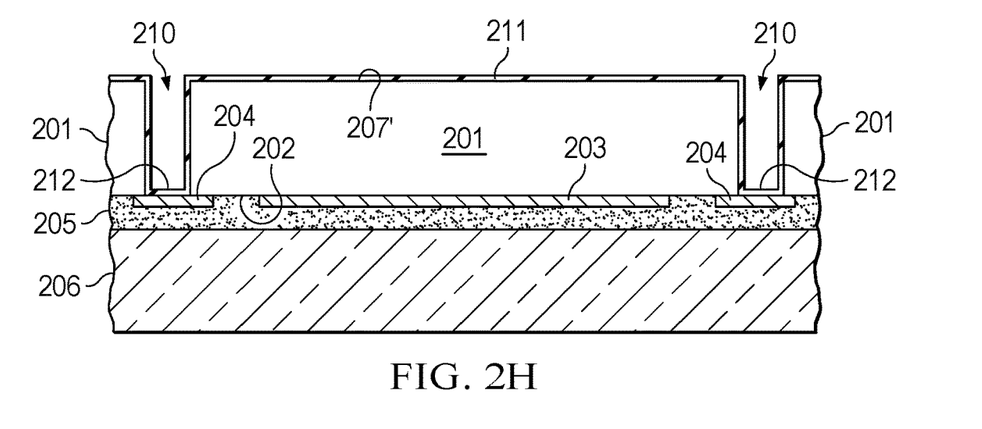

In FIG. 2H, a layer of silicon dioxide (SiO2) 211 is applied over the back surface 207' of semiconductor 201 and to the walls of TSVs 210. The SiO2 layer 211 is a dielectric and functions as an insulator to isolate elements in the device. The SiO2 layer 211 may be deposited by methods including chemical vapor deposition (CVD) or plasma enhanced CVD (PECVD). The bottom surfaces of TSVs 210 are covered by a portion of the SiO2 mask 212.

Figure 2I:
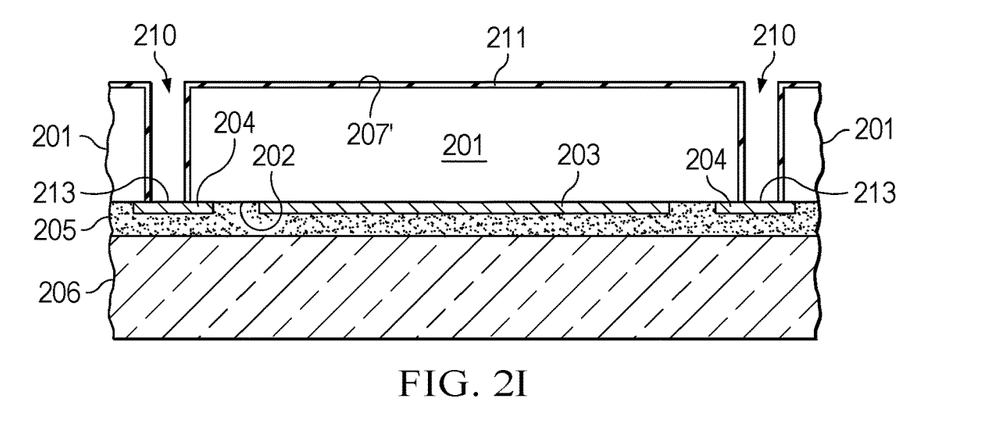

In FIG. 2I, dry etching of the SiO2 mask 212 at the bottom of the TSVs 210 removes the SiO2 mask 212 and creates openings 213 in each TSV 210 to expose bond pad 204.

Figure 2J:
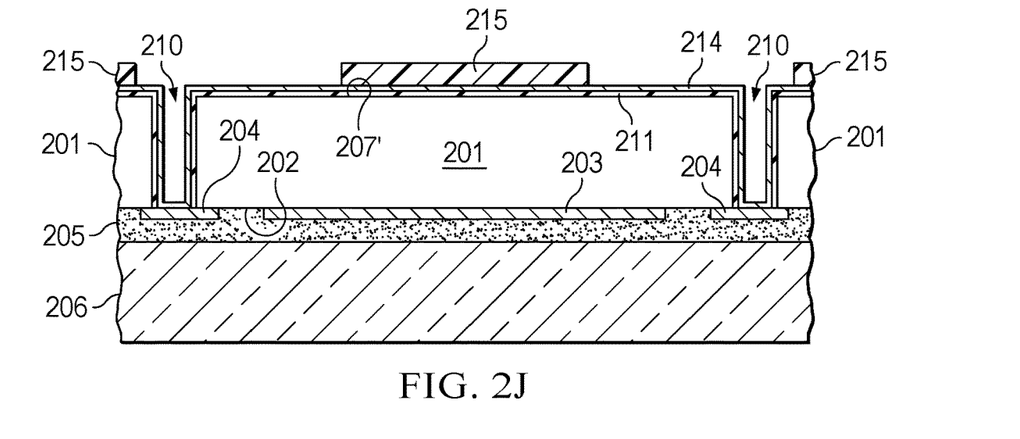

In FIG. 2J, a seed metal layer 214 is deposited on the SiO2 layer 211 in and around TSVs 210. The seed metal layer 214 is made from metal, such as titanium, copper, titanium tungsten, or a combination of such metals. A photoresist layer 215 is patterned over portions of the seed metal layer 214. The photoresist layer 215 may be a liquid photoresist that is coated by spin coater over the seed metal layer 214.

Figure 2K:
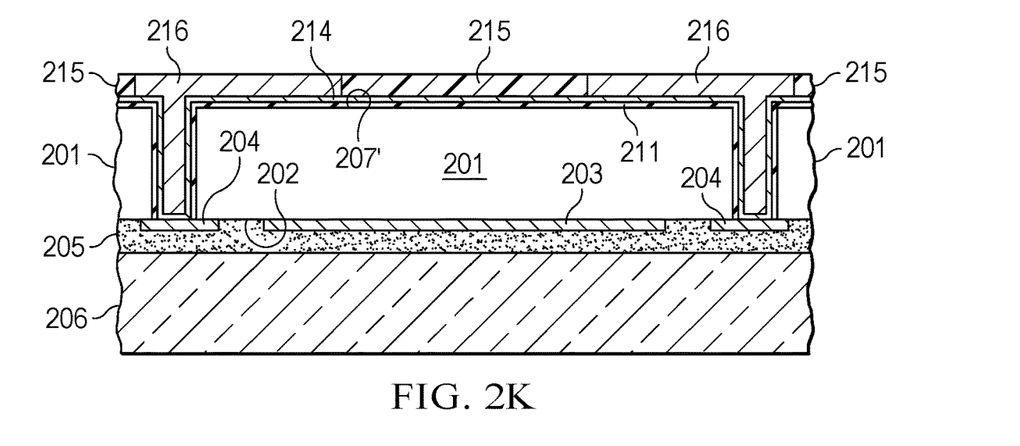

In FIG. 2K, a metal layer 216 is deposited over the seed metal layer 214. The metal layer 216 is plated in and around the TSVs 210.

Figure 2L:
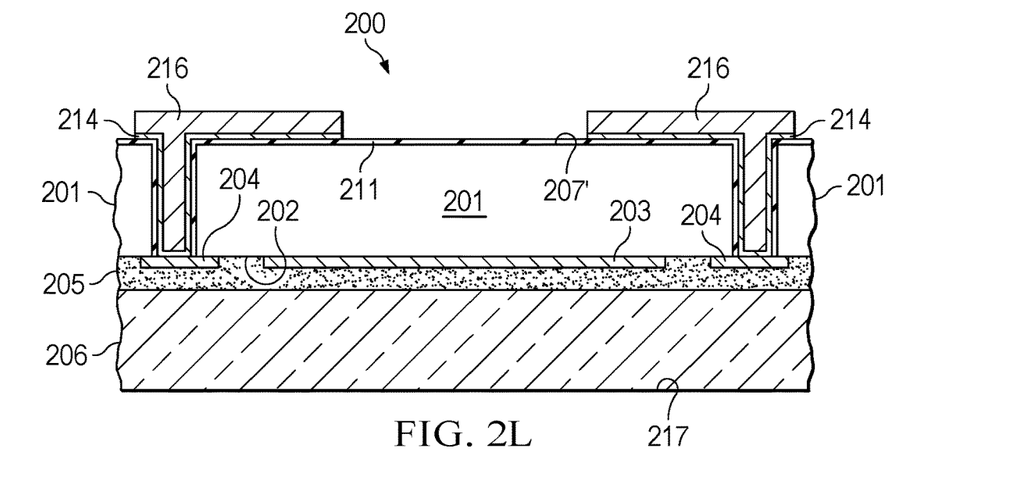

In FIG. 2L, the photoresist layer 215 is removed seed metal layer is etched to form the pattern of metal layer 216 as shown. The remaining metal layer 216 may be a redistribution layer (RDL) made from metal, such as copper, that is used for making electrical connections. Other conductive material may also be used. The metal layer 216 provides an electrical connection from the top side of semiconductor die 201 down to the embedded bond pad layer 204. Metal layer 216 may be used as contacts to connect to the bond pads or other contacts on the active surface 203 of semiconductor die 201.

The device 200 shown in FIG. 2L may be turned upside down so that the semiconductor die 201 is in the face-up position. After the device 200 is inverted, the insulator 206 is thinned by grinding the back surface 217. The back grinding of the insulator 206 exposes a shallower back surface and reduces the thickness of the insulator from an original thickness. In one arrangement, the insulator 206 is reduced to less than 50 um thick.

Figure 3:
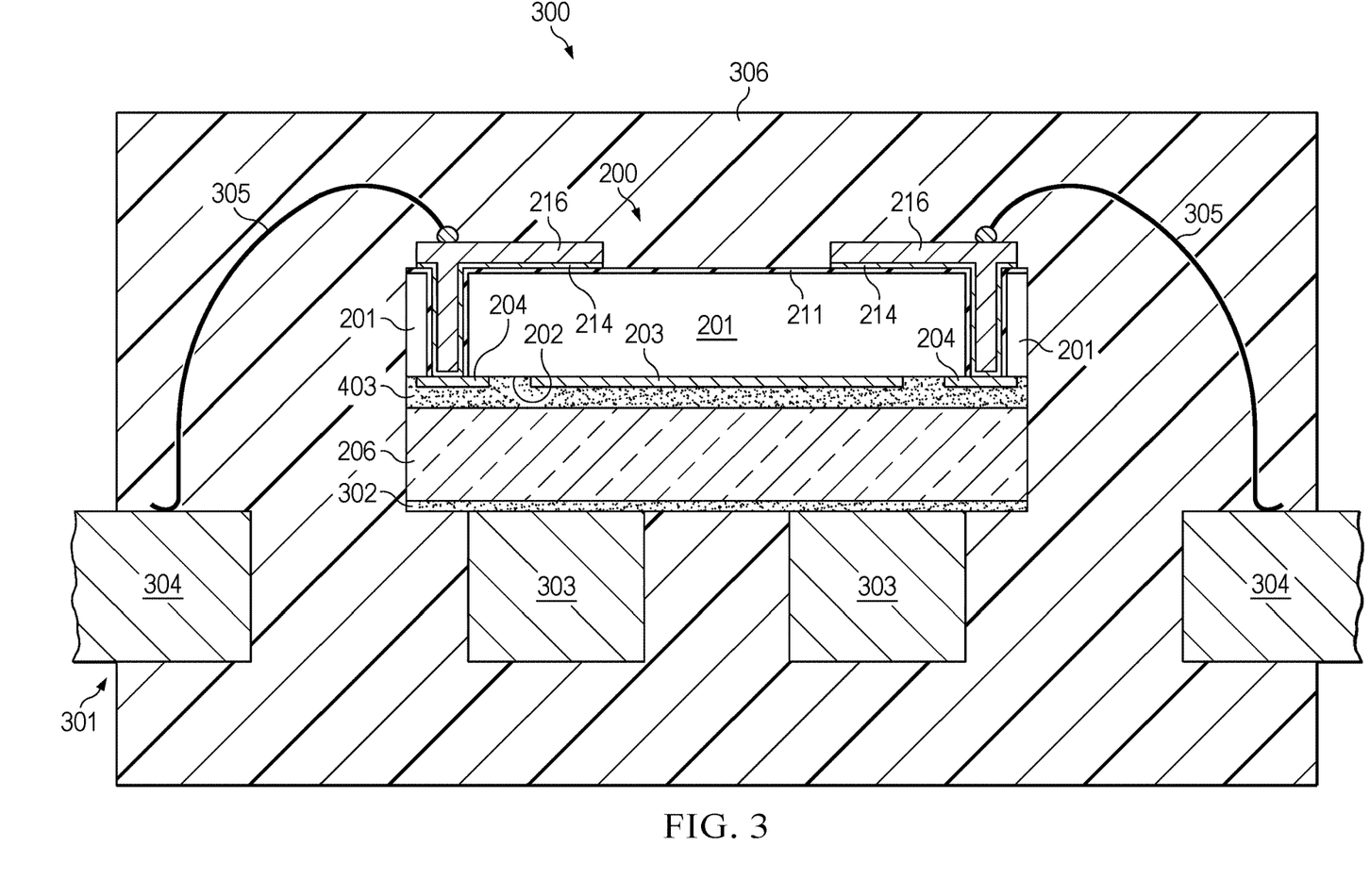
FIG. 3 is a cross section view of a Hall-effect sensor package comprising a Hall-effect device attached in a face-down configuration on a leadframe.

FIG. 3 is a cross section view of a Hall-effect sensor package 300 comprising a Hall-effect device 200 attached in a face-down configuration on a leadframe 301. The Hall-effect device 200 may be manufactured as illustrated in FIGS. 2A-L. A die attach paste 302 or die attach film is used to mount device 200 on lead frame 301. Lead frame portion 303 is part of a field generating current path, such as the curved head section 106 shown in FIGS. 1A-B. Lead frame portion 303 passes under the Hall-effect IC die 201 without touching it. Insulator 206 provides a high degree of isolation between the sensing area 203 and the field generating current path in lead frame section 303.

The segments of metal layer 216 on Hall-effect device 200 are attached to leads 304 on leadframe 301 by bond wires 305. Leads 304 correspond to leads or pins 107-110 in FIGS. 1A-B, which are used to electrically connect input or output signals to the leadframe 301. The metal layer 216 in TSVs 210 provides an electrical connection between bond wires 305 and leads 304 to the bond pads 204 or other contacts on the active surface 203 of semiconductor die 201.

The arrangement illustrated in FIG. 3 provides a high level of insulation between sensing area 203 and leadframe 301 using the integrated insulator 206. This provides better sensing capability due to face-down structure of the Hall-effect device 200. The overall package size is minimized using the TSV structure.

The Hall-effect sensor package 300 further comprises a mold compound encapsulating the Hall-effect device 200, leadframe 301, and bond wires 305. Leads 304 are exposed through one or more sides of the mold compound 306 for attachment to external devices.

Figure 4:
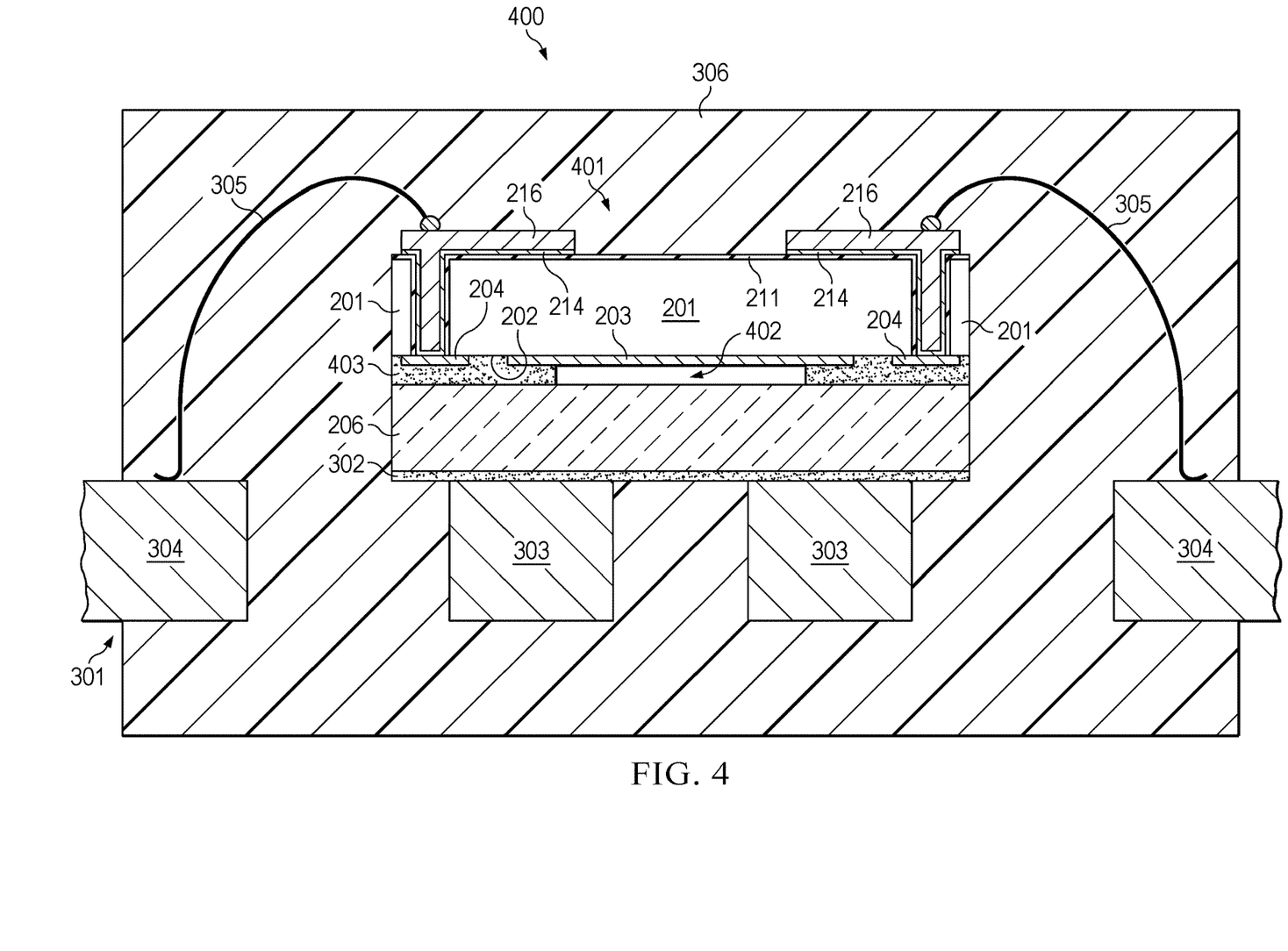
FIG. 4 is a cross section view of an alternative Hall-effect sensor package comprising a Hall-effect device that includes a stress relief cavity between an insulator and a semiconductor die.

FIG. 4 is a cross section view of an alternative Hall-effect sensor package 400 comprising a Hall-effect device 401 that is attached in a face-down configuration on leadframe 301. The alternative Hall-effect sensor package 400 has many of the same components as the Hall-effect sensor device 200, which are labeled using the same numbers in FIG. 3 as used earlier. A significant difference in alternative Hall-effect sensor package 400 is the addition of a cavity 402 between the semiconductor or IC die 201 and the insulator 206. Cavity 402 provides stress isolation to counteract mechanical stresses introduced during the assembly process.

Cavity 402 may be created by removing the bonding material 403 under the central portion of the semiconductor die 201. The bonding material 403 may be an adhesive, such as SU-8 or BCB (benzocyclobutene), that is specialized for electronic component production. Bonding material 403 may be photosensitive material or non-photosensitive material. If the isolation cavity 402 is desired due to mechanical stress, a photosensitive bonding material 403 may be applied to surface 202 during manufacture and then a portion of the bonding material 403 removed in the central area 402.

Hall-effect sensor package 400 further comprises the mold compound encapsulating the Hall-effect device 401, leadframe 301, and bond wires 305. Leads 304 are exposed through one or more sides of the mold compound 306 for attachment to external devices.

A Hall-effect sensor package in one arrangement comprises an IC die having at least one Hall-effect sensor element located on or near an active side of the IC die. The Hall-effect sensor package also has a portion of a leadframe. The leadframe portion includes a first set of leads that provide a field generating current path including a U-shaped section for directing a field generating current so that a magnetic field reaches the Hall-effect sensor element. The leadframe portion also includes a second set of leads for exchanging signals with the IC die. The Hall-effect sensor package has an insulator with a first side and a second side. The first side is attached to the leadframe, and the second side is attached to the active side of the IC die. The Hall-effect sensor package further comprises at least one through substrate via (TSV) in the IC die. The at least one TSV extends from a back side of the IC die to the active side. The at least one TSV comprises a metal layer that electrically couples a contact on the back side to a bond pad on the active side.

The IC package further comprises an RDL on the second surface of the semiconductor die. The RDL electrically couples the bond pads on active surface of die to the contact on the second surface of die using TSVs.

The Hall-effect sensor package further comprises at least one lead in the leadframe portion. A bond wire electrically couples the at least one lead to the metal layer on the at least one TSV.

The Hall-effect sensor package further comprises a bonding material between the IC die and the insulator and a die attach material between the insulator and the leadframe.

In some arrangements, the Hall-effect sensor package further comprises a cavity formed in the bonding material between the insulator and the Hall-effect sensor.

In another arrangement, a semiconductor package comprises a semiconductor die including at least one Hall-effect sensor element located on or near an active side of the semiconductor die, a plurality of TSVs in the semiconductor die extending from a back side of the semiconductor die to the active side, leadframe segments, and an insulator having a first side and a second side, wherein the first side is attached to the leadframe segments and the second side attached to the active side of the semiconductor die. Each of the plurality of TSVs include a metal layer electrically coupling a contact on the back side to a bond pad on the active side. The RDL is electrically coupled to a bond pad on the active side. The leadframe segments comprise a first set of leads providing a field generating current path including a U-shaped section for directing a field generating current so that a magnetic field reaches the Hall-effect sensor element. The leadframe segments also comprise a second set of leads for exchanging signals with the semiconductor die. The signals include one or more of a supply voltage, a sensed Hall voltage, a reference voltage, and a ground.

The leadframe segments in the semiconductor package further comprise a plurality of leads and bond wires electrically coupling each of the plurality of leads to the metal layer one of the plurality of TSVs.

The semiconductor package further comprises a bonding material between the semiconductor die and the insulator, and a die attach material between the insulator and the leadframe.

The semiconductor package may further comprise a cavity formed in the bonding material between the insulator and the Hall-effect sensor.

A further arrangement of an IC package comprises a semiconductor die having a first surface and a second surface with a Hall-effect sensor circuit located on or near first surface, a plurality of TSVs in the semiconductor die, a portion of a leadframe having a first set of leads and a second set of leads, and an insulator having a first side and a second side. The plurality of TSVs each have a metal layer extending from the first surface of the semiconductor die to the second surface. The first side of the insulator is attached to the leadframe using a die attach material, and the second side of the insulator is attached to the first side of the semiconductor die using a bonding material. The first set of leads provide a field generating current path for directing a magnetic field toward the Hall-effect sensor circuit, and the second set of leads are attached to bond pads on the semiconductor die. A redistribution layer on the second surface of the semiconductor die electrically couples a contact on the second surface to the bond pads on the first surface using the TSVs. The first set of leadframe leads are positioned on a first side of the IC package and the second set of leadframe leads are positioned on a second side of the IC package.

The IC package may further comprise a cavity formed in the bonding material between the insulator and the Hall-effect sensor. The cavity is located adjacent to the Hall-effect sensor circuit. The cavity is formed in the bonding material and extends between the second side of the insulator and the first surface of the semiconductor die.

While various examples of the present disclosure have been described above, it should be understood that they have been presented by way of example only and not limitation. Numerous changes to the disclosed examples can be made in accordance with the disclosure herein without departing from the spirit or scope of the disclosure. Modifications are possible in the described embodiments, and other embodiments are possible, within the scope of the claims. Thus, the breadth and scope of the present invention should not be limited by any of the examples described above. Rather, the scope of the disclosure should be defined in accordance with the following claims and their equivalents.

What is claimed is:

1. A Hall-effect sensor package, comprising:
an integrated circuit (IC) die including at least one Hall-effect sensor element located on or near an active side of the IC die;
a portion of a leadframe including:
a first set of leads including a U-shaped section for directing a field generating current so that a magnetic field reaches the Hall-effect sensor element; and
a second set of leads for exchanging signals with the IC die; and
an insulator having a first surface and a second surface, the first surface attached to the portion of the leadframe and the second surface attached to a bonding material, the bonding material physically contacting a top surface and a side surface of the at least one Hall-effect sensor element, the side surface at an angle with respect to the top surface of the at least one Hall-effect sensor element.

2. The Hall-effect sensor package of claim 1, further comprising:
at least one through substrate via (TSV) in the IC die, the at least one TSV extending from a back side of the IC die to the active side.

3. The Hall-effect sensor package of claim 2, wherein the at least one TSV comprises a metal layer electrically coupling a contact on the back side to a bond pad on the active side.

4. The Hall-effect sensor package of claim 3, further comprising a redistribution layer (RDL) on the back side of the IC die, wherein the RDL electrically couples the bond pads on the active surface of the IC die to the contact on the back side using TSVs.

5. The Hall-effect sensor package of claim 3, further comprising:
at least one lead in the portion of the leadframe; and
a bond wire electrically coupling the at least one lead to the metal layer on the at least one TSV.

6. The Hall-effect sensor package of claim 1, further comprising:
a die attach material between the insulator and the portion of the leadframe.

7. The Hall-effect sensor package of claim 6, further comprising:
a cavity formed in the bonding material between the insulator and the Hall-effect sensor.

8. A semiconductor package, comprising:
a semiconductor die including at least one Hall-effect sensor element located on or near an active side of the semiconductor die;
a plurality of through substrate vias (TSV) in the semiconductor die, the plurality of TSVs extending from a back side of the semiconductor die to the active side; leadframe segments; and
a borosilicate glass component including a first side and a second side, the first side attached to the leadframe segments and the second side attached to the active side of the semiconductor die.

9. The semiconductor package of claim 8, wherein each of the plurality of TSVs include a metal layer electrically coupling a contact on the back side to a bond pad on the active side.

10. The semiconductor package of claim 9, wherein the metal layer is electrically coupled to a bond pad on the active side.

11. The semiconductor package of claim 8, wherein the leadframe segments further comprise:
a first set of leads providing a field generating current path including a U-shaped section for directing a field generating current so that a magnetic field reaches the Hall-effect sensor element; and
a second set of leads for exchanging signals with the semiconductor die.

12. The semiconductor package of claim 11, wherein the signals include one or more of a supply voltage, a sensed Hall voltage, a reference voltage, and a ground.

13. The semiconductor package of claim 9, further comprising:
a plurality of leads in the leadframe segments; and
bond wires electrically coupling each of the plurality of leads to the metal layer of one of the plurality of TSVs.

14. The semiconductor package of claim 8, further comprising:
a bonding material between the semiconductor die and the borosilicate glass component; and
a die attach material between the borosilicate glass component and the leadframe segments.

15. The semiconductor package of claim 14, further comprising:
a cavity formed in the bonding material between the borosilicate glass component and the Hall-effect sensor.

16. An integrated circuit (IC) package, comprising:
a semiconductor die having a first surface and a second surface, a Hall-effect sensor circuit located on or near the first surface;
a plurality of through substrate vias (TSV) in the semiconductor die, the plurality of TSVs each having a metal layer extending from the first surface of the semiconductor die to the second surface;
a portion of a leadframe having a first set of leads and a second set of leads, the second set of leads attached to bond pads on the semiconductor die;
an insulator having a first side and a second side, the first side attached to the leadframe using a die attach material and the second side attached to the first surface of the semiconductor die using a bonding material, and
a cavity formed in the bonding material, the cavity extending between the second side of the insulator and the first surface of the semiconductor die.

17. The IC package of claim 16, further comprising:
a redistribution layer (RDL) on the second surface of the semiconductor die, the RDL electrically coupling a contact on the second surface to the bond pads on the first surface using the TSVs.

18. The IC package of claim 16, wherein the first set of leadframe leads are positioned on a first side of the IC package and the second set of leadframe leads are positioned on a second side of the IC package.

19. The IC package of claim 16, further comprising:
a cavity formed in the bonding material between the insulator and the Hall-effect sensor circuit, the cavity located adjacent to the Hall-effect sensor circuit.

* * * * *